(12) United States Patent
Abbott et al.

(10) Patent No.: US 9,728,889 B2
(45) Date of Patent: Aug. 8, 2017

(54) CIRCUIT CARD

(71) Applicant: Goodrich Corporation, Charlotte, NC (US)

(72) Inventors: Michael Abbott, Shelburne, VT (US);
Andrew Slanker, Fairborn, OH (US);
Brian Syverson, Huntington, VT (US);
Eric Joseph Reed, Troy, OH (US);
Scott R Durkee, New Haven, VT (US);
Alexander White, Charlotte, NC (US)

(73) Assignee: Goodrich Corporation, Charlotte, NC (US)

( * ) Notice: Subject to any disclaimer, the term of this patent is extended or adjusted under 35 U.S.C. 154(b) by 38 days.

(21) Appl. No.: 14/817,886

(22) Filed: Aug. 4, 2015

(65) Prior Publication Data
US 2017/0040739 A1    Feb. 9, 2017

(51) Int. Cl.
| H01R 13/58 | (2006.01) |
| H01R 12/70 | (2011.01) |
| H01R 43/20 | (2006.01) |
| H05K 1/02 | (2006.01) |
| H05K 1/11 | (2006.01) |

(52) U.S. Cl.
CPC ......... H01R 13/58 (2013.01); H01R 12/7076 (2013.01); H01R 43/205 (2013.01); H05K 1/0271 (2013.01); H05K 1/115 (2013.01); H05K 1/0257 (2013.01); H05K 1/116 (2013.01); H05K 2201/09063 (2013.01); H05K 2201/09936 (2013.01); H05K 2201/10287 (2013.01); H05K 2201/10356 (2013.01)

(58) Field of Classification Search
CPC ....................................................... H01R 13/58
See application file for complete search history.

(56) References Cited

U.S. PATENT DOCUMENTS

| 4,181,394 | A | * | 1/1980 | Dodge | H01R 13/5845 |
| | | | | | 439/455 |
| 4,527,855 | A | * | 7/1985 | Dietrich | H01R 13/58 |
| | | | | | 439/451 |
| H113 | H | * | 8/1986 | McNeel | H01R 13/5833 |
| | | | | | 439/282 |
| 4,720,155 | A | * | 1/1988 | Schildkraut | H05K 9/0007 |
| | | | | | 439/108 |
| 4,900,266 | A | * | 2/1990 | Sainsbury | H01R 23/661 |
| | | | | | 439/451 |
| 5,244,417 | A | | 9/1993 | Perretta | |
| 5,340,333 | A | * | 8/1994 | Schroth | H01R 31/06 |
| | | | | | 439/607.25 |
| 5,342,203 | A | * | 8/1994 | Perretta | H01R 12/59 |
| | | | | | 439/76.1 |

(Continued)

OTHER PUBLICATIONS

Extended European Search Report dated Feb. 1, 2017 in European Application No. 16182401.6.

*Primary Examiner* — James Harvey
(74) *Attorney, Agent, or Firm* — Snell & Wilmer L.L.P.

(57) ABSTRACT

A circuit card is disclosed. The circuit card may have a strain relief aperture and a conductor contact. A conductor may extend through the strain relief aperture and connect in electrical continuity with the conductor contact. The circuit card may have a conformal coating, such as poly(p-xylylene) polymer applied. The conformal coating may be applied in layers, and the layers may have different thicknesses.

16 Claims, 4 Drawing Sheets

(56) References Cited

U.S. PATENT DOCUMENTS

| | | | | |
|---|---|---|---|---|
| 5,655,933 | A * | 8/1997 | Skowronski | H01R 31/02 29/844 |
| 6,190,196 | B1 * | 2/2001 | Kato | H01R 12/772 439/493 |
| 6,422,885 | B2 * | 7/2002 | Kain | H01R 13/6315 439/247 |
| 6,821,130 | B2 * | 11/2004 | Danley | H01F 5/04 439/329 |
| 7,048,564 | B1 * | 5/2006 | Hinze | B60R 16/0239 361/742 |
| 9,601,866 | B1 * | 3/2017 | Petersen | H01R 13/58 |
| 2004/0015630 | A1 | 1/2004 | Boolos et al. | |
| 2005/0230148 | A1 * | 10/2005 | Sinnett | B60C 23/0452 174/267 |
| 2006/0016069 | A1 * | 1/2006 | Kent | H01R 13/6658 29/825 |
| 2007/0230142 | A1 * | 10/2007 | Engel | H05K 3/3405 361/748 |
| 2008/0233783 | A1 * | 9/2008 | Jacobson | H01R 13/5205 439/271 |
| 2008/0305658 | A1 * | 12/2008 | Ko | H01R 13/5808 439/76.1 |
| 2011/0151111 | A1 | 6/2011 | Lawrence et al. | |
| 2012/0220168 | A1 | 8/2012 | Kreider et al. | |
| 2014/0233189 | A1 * | 8/2014 | Shin | H05K 1/0203 361/720 |
| 2017/0040739 | A1 * | 2/2017 | Abbott | H01R 12/7076 |

* cited by examiner

CIRCUIT CARD

FIELD

The present disclosure relates to circuit cards, and more particularly, circuit cards for use within electrical connector assemblies.

BACKGROUND

Aircraft typical include numerous sensor and effector systems whereby vehicle functions are controlled and monitored. Moreover, such systems typically include connectorized electrical wiring to conduct power and signals among different system components. However, in various instances, the strength of a signal conducted along connectorized electrical wiring degrades over the path of the wiring, such as due to parasitic shunt resistances. However, the installation of amplifiers along the path of connectorized electrical wiring contributes unwanted bulk and complexity to wiring systems, as well as increasing the number of connectors needed along a wiring path.

SUMMARY

According to various embodiments, a circuit card is disclosed. The circuit card may include a printed circuit board having a first strain relief aperture positioned in and extending through a stay out zone of the circuit card proximate to a boundary edge of the circuit card, and a first conductor contact positioned in a conductor interface region of the circuit card proximate the stay out zone and radially inward of the stay out zone relative to a central axis of the circuit card. A populated region of the circuit card may be configured to be populated with electronic components and may be a region of the circuit card radially inward of the conductor interface region. The first conductor contact may include one of a solder pad and a through hole. A conductor may be received through the first strain relief aperture and connected in electrical communication with the first conductor contact.

The circuit card may further include a bore including an opening disposed through the circuit card and positioned radially inward of the populated region. The bore may be located at a center of the circuit card. The bore may comprise a square aperture.

The circuit card may include a labeling area including a crescent shaped partial annulus disposed within the populated region and radially opposite the first strain relief aperture.

The circuit card may include a conformal coating of a poly(p-xylylene) polymer. The conformal coating may include a proximal coating zone having a backside depth and a front side depth wherein the conformal coating includes a proximal coating zone thickness, and a mesial coating zone disposed axially outward of the proximal coating zone relative to the central axis of the circuit card and having a mesial coating zone depth wherein the conformal coating includes a mesial coating zone thickness. In various embodiments, the mesial coating zone thickness and the proximal coating zone thickness are different.

In various embodiments, the proximal coating zone thickness may be about 0.0005 to about 0.0007 inches, and the mesial coating zone thickness may be about 0.0000 to about 0.0007 inches. The backside depth may be about 0.05 inches, and the front side depth may be between about 0.0015 inches to about 0.015 inches. The mesial coating zone depth may be about 0.75 inches.

In various embodiments, the backside depth may be about 0.05 inches, the front side depth may be between about 0.0015 inches to about 0.015 inches, the mesial coating zone depth may be about 0.75 inches, the proximal coating zone thickness may be about 0.0005 to about 0.002 inches, or may be about 0.0005 to about 0.0007 inches, or may be about 0.001 inches, and the mesial coating zone thickness may be about 0.0000 to about 0.0007 inches.

According to various embodiments, an electrical wiring assembly is disclosed. The electrical wiring assembly may include a connector back shell and a circuit card disposed within the connector back shell, whereby at least one of signals and power conducted via a cable connectorized at the connector back shell are conditioned. The circuit card may include a first strain relief aperture positioned in and extending through a stay out zone of the circuit card proximate to a boundary edge of the circuit card, and a first conductor contact positioned in a conductor interface region of the circuit card proximate the stay out zone and radially inward of the stay out zone relative to a central axis of the circuit card. A populated region of the circuit card populated with electronic components may form a region of the circuit card radially inward of the conductor interface region. The circuit card may include a conformal coating of a poly(p-xylylene) polymer.

In various embodiments, the connector back shell is bonded directly to the circuit card by an adhesive disposed between the conformal coating of the circuit card and the connector back shell.

Moreover, the conformal coating may include a proximal coating zone including a backside depth and a front side depth wherein the conformal coating includes a proximal coating zone thickness, and a mesial coating zone disposed axially outward of the proximal coating zone relative to the central axis of the circuit card and having a mesial coating zone depth wherein the conformal coating includes a mesial coating zone thickness.

The circuit card may also include a bore having an opening disposed through the circuit card and positioned radially inward of the populated region. The bore may be located at a center of the circuit card. The bore may be a square aperture.

A method of making a circuit card including a printed circuit board is disclosed. The method may include forming a first strain relief aperture positioned in and extending through a stay out zone of the circuit card proximate to a boundary edge of the circuit card, and forming a first conductor contact positioned in a conductor interface region of the circuit card proximate the stay out zone and radially inward of the stay out zone relative to a central axis of the circuit card. A populated region of the circuit card configured to be populated with electronic components may be a region of the circuit card radially inward of the conductor interface region.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration and their best mode. While these exemplary embodiments are described in sufficient detail to enable those skilled in the art to practice the disclosure, it should be understood that other embodiments may be realized and that logical changes may be made without departing from the spirit and scope of the disclosure. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step.

The present disclosure relates to a circuit card for electrical wiring systems. In various instances, signal degradation over the length of electrical wiring of an electrical wiring system gives rise to a desire to incorporate signal amplifiers in the electrical wiring. In various embodiments, various other electronics are desired to be implemented in the electrical wiring. In various embodiments, a circuit card is configured to be installed inside a back shell of a connector associated with the electrical wiring. In this manner, signal properties can be electronically manipulated, such as by being amplified, without need for bulky and obtrusive external amplifiers, or additional connectorization to insert an amplifier device in the path of the wiring. Thus, limited available space, such as the limited available space within an aircraft, is utilized efficiently, and without additional connectorization and/or potential failure points.

Figure 1:
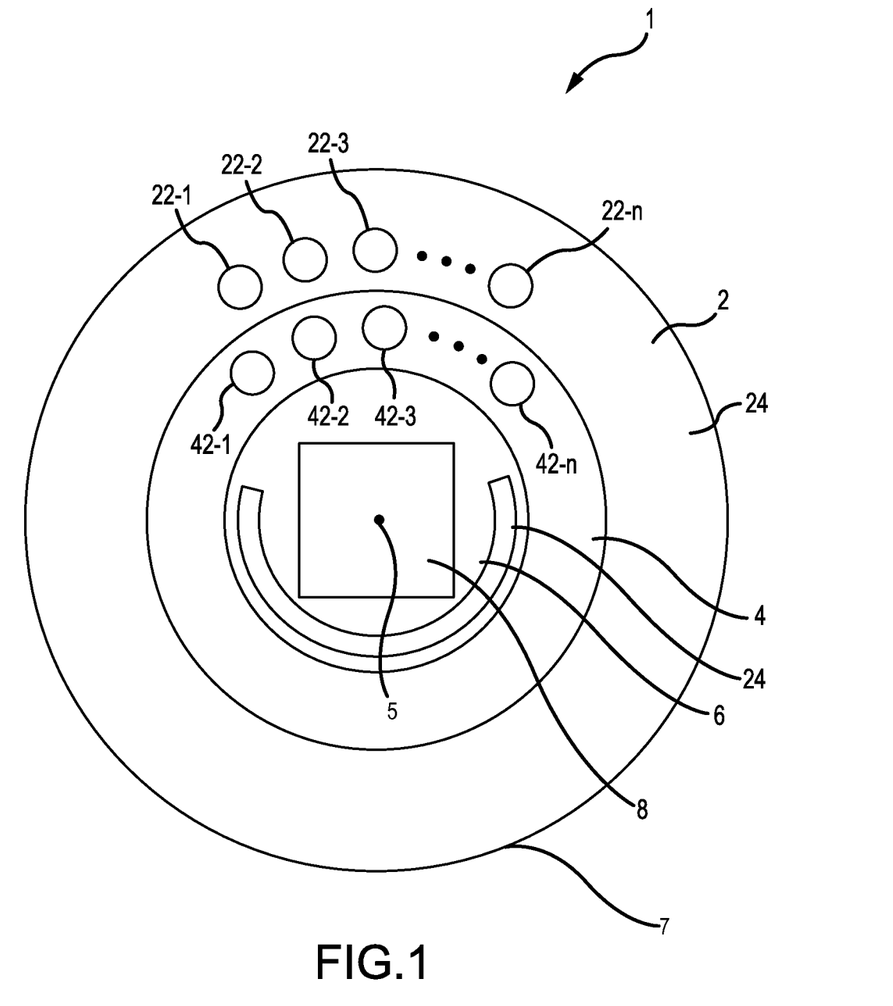
FIGS. 1 and 2 depict end views of example circuit cards, in accordance with various embodiments.

For instance, with reference to FIG. 1, according to various embodiments, circuit card 1 is disclosed. A circuit card 1 may comprise a printed circuit board (PCB). The printed circuit board may have a shape. In various embodiments, the shape of the printed circuit board corresponds to the shape of a volume within a connector back shell. For instance, in various embodiments, the printed circuit board is a round wafer, and is configured to fit within a connector back shell having a cylindrical portion. However, the printed circuit board may be trapezoidal, triangular, irregularly shaped, oval, and/or any shape as desired.

The circuit card 1 may comprise a variety of features. For instance, a circuit card 1 may comprise a stay out zone 2. A stay out zone 2 may comprise a region of the circuit card proximate to the boundary edge 7 of the circuit card 1. The stay out zone 2 may comprise a region of the circuit card 1 coincident with a spark gap sufficiently small that in the event of overvoltage situations, such as a lightning strike, arcing would occur between uninsulated conductors (if any) in the stay out zone 2 and the surrounding connector back shell. Thus, in various embodiments, the stay out zone 2 comprises a region of the circuit card 1 wherein no uninsulated conductors are disposed. As such, conductors may be mated to the circuit card 1 in different regions of the circuit card 1, but may transition to being insulated if and when passing through the stay out zone 2. Consequently, the stay out zone 2 may comprise strain relief apertures such as a first strain relief aperture 22-1, a second strain relief aperture 22-2, a third strain relief aperture 22-3, and/or any number of strain relief apertures 22-n. An insulated conductor may pass through each strain relief aperture, whereby mechanical strain, such as tension, compression, torsion, side loads, and/or other mechanical loads, may be conducted along a load path away from an electrical connection between the conductor and the circuit card 1, such as an electrical connection between a conductor and a conductor pad, such as conductor contact 42-1, 42-2, 42-3, and/or 42-n which would be positioned within other region(s) of the circuit card 1.

The circuit card 1 may comprise a conductor interface region 4. A conductor interface region 4 may comprise a region of the circuit card 1 proximate to the stay out zone 2, and radially inward of the stay out zone 2, such as adjoining the opposite side of the stay out zone 2 relative to the boundary edge 7. For instance, the conductor interface region 4 may be radially inward of the stay out zone 2 relative to a central axis 5 of the circuit card 1. In various embodiments, the conductor interface region 4 may comprise conductor contacts, such as a first conductor contact 42-1, a second conductor contact 42-2, a third conductor contact 42-3 and/or any number conductor contact 42-n. In various embodiments, there are an equal number of conductor contacts 42-1, 42-2, 42-3, 42-n as there are strain relief apertures 22-1, 22-2, 22-3, and 22-n. In this manner, each conductor 3 interfacing with the circuit card 1 at a conductor contact may also enjoy strain relief at a strain relief aperture. Each conductor contact is configured to receive a conductor in electrical communication with the circuit card 1. For instance, a conductor contact may comprise a solder pad, or a through hole, or a lug, or a tab, or a flange, or a fastener, and/or any other mechanism whereby electrical continuity between a conductor and the conductor contact (and thus the circuit card 1) may be established.

The circuit card 1 may comprise a populated region 6. A populated region 6 may comprise a region of the circuit card 1 that is populated or that is configured to be populated with electronic components, such as any number of active electronic components and/or passive electronic components. For instance, integrated circuits, resistors, capacitors, inductors, switches, semiconductor devices such as diodes and/or transistors, microprocessors, memories, amplifiers, and/or the like may populate the populated region 6. In various embodiments, the populated region 6 comprises a region of the circuit card 1 radially inward of the conductor interface region 4; however, the populated region 6 may comprise any region of the circuit card 1 as desired. In various embodiments, the populated region 6 comprises a labeling area 24. A labeling area 24 may comprise a two dimensional surface area portion of the populated region 6 configured to have human-readable and/or machine readable graphics, text or other labeling applied. In various embodiments, the labeling area 24 comprises a crescent shaped partial annulus disposed within the area of the populated region 6 and radially opposite the strain relief apertures 22-1, 22-2, 22-3, and/or 22-n. For instance, the labeling area 24 may comprise a crescent shaped partial annulus disposed within the populated region 6 and radially opposite the first strain relief aperture 22-1. In various embodiments, the labeling area 24 comprises a two dimensional surface area shaped as an annulus, partial annulus, or a trapezoid and/or any shape as desired.

The circuit card 1 may comprise a bore 8. The bore 8 may comprise an opening disposed through the circuit card 1 and positioned inwardly of the populated region 6. In various embodiments, the bore 8 is located at the central axis 5 of the circuit card 1. The bore 8 may be configured to permit other aspects of a connector extend through the circuit card 1, for instance, connector pins, connector sockets, back shell components, and/or the like. The bore 8 may have any desired shape. For instance, the bore 8 may be quadrilateral, trapezoidal or may be circular (see FIG. 2) or may be oval, or may be star shaped, or may be any shape as desired. The bore 8 may comprise a square aperture.

Figure 2:
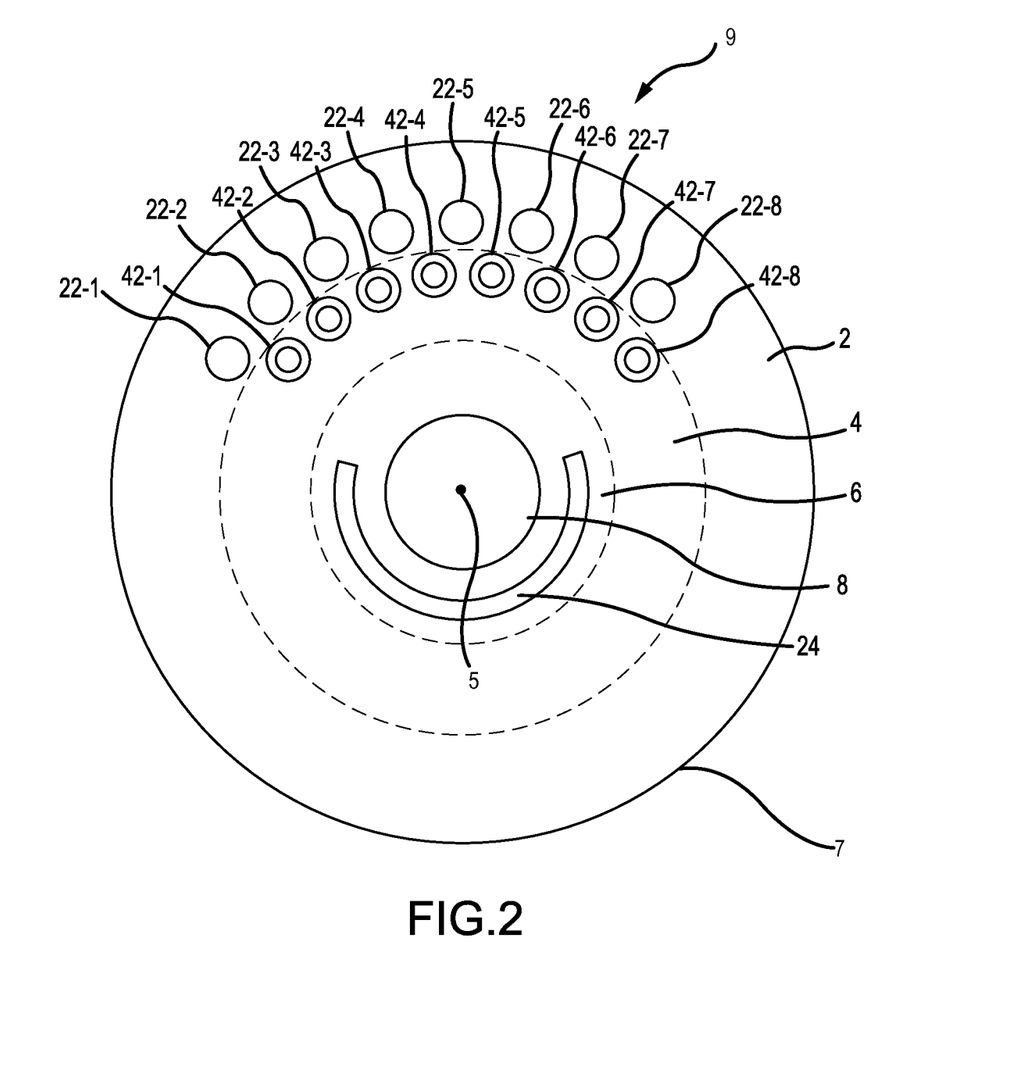

With reference now to FIG. 2, circuit card 9, according to various embodiments, may share features of circuit card 1 (FIG. 1), wherein like numerals denote like structures. The circuit card 9 comprises a circular printed circuit board comprising various features. For instance, the circuit card 9 comprises a stay out zone 2 comprising a region of the circuit card 9 proximate to the boundary edge 7 of the circuit card 9 and having a first strain relief aperture 22-1, a second strain relief aperture 22-2, a third strain relief aperture 22-3, a fourth strain relief aperture 22-4, a fifth strain relief aperture 22-5, a sixth strain relief aperture 22-6, a seventh strain relief aperture 22-7 and an eighth strain relief aperture 22-8. Moreover, the circuit card 9 comprises a conductor interface region 4 disposed radially inward of the stay out zone 2 and comprising a first conductor contact 42-1, a second conductor contact 42-2, a third conductor contact 42-2, a fourth conductor contact 42-4, a fifth conductor contact 42-5, a sixth conductor contact 42-6, a seventh conductor contact 42-7, and an eighth conductor contact 42-8. The circuit card 9 comprises a populated region 6, comprising a region of the circuit card 9 disposed radially inward of the conductor interface region 4 and populated with at least one of an active electronic component and/or a passive electronic component. A labeling area 24 may comprise a crescent shaped partial annular section of the populated region 6 configured to receive labeling, such as by silk screen printing. The circuit card 9 may comprise a bore 8, comprising a circular opening disposed through the circuit card 9 and positioned at its central axis 5.

Figure 3:
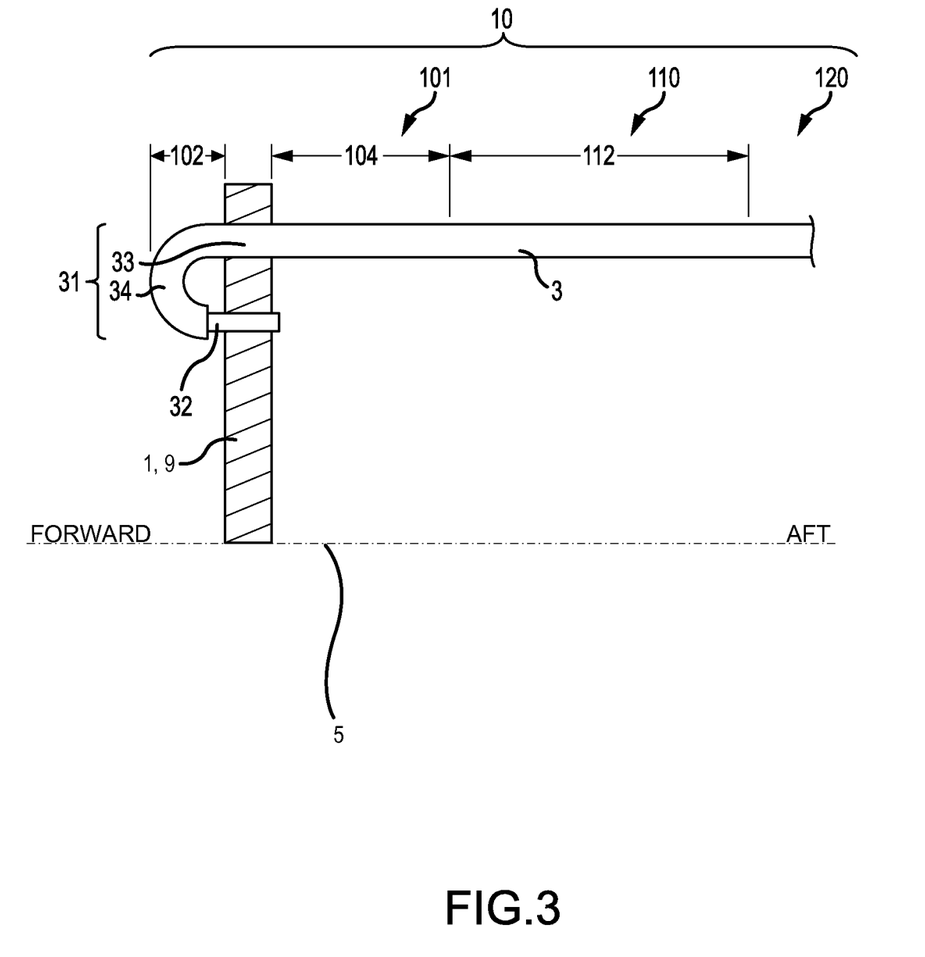
FIG. 3 depicts a side view of a circuit card, in accordance with various embodiments.

With reference to FIG. 3, a circuit card 1 and 9 may be configured to receive one or more conductor 3, according to various embodiments. For instance, while FIGS. 1 and 2 depict end views of a circuit card 1 and a circuit card 9, respectively, FIG. 3 depicts a side view of a circuit card 1 or a circuit card 9 having a conductor 3 inserted according to the teachings herein. A conductor 3 may comprise an at least partially insulated wire extending through a strain relief aperture of the circuit card 1 or circuit card 9 and electrically connected to a conductor contact of the circuit card 1 or circuit card 9. For example, the conductor 3 may have a strain relief portion 31 and a conduction portion 32. The strain relief portion 31 may comprise a strain relief aperture pass-through 33 and a bent portion 34. The strain relief aperture pass-through 33 may comprise a portion of the conductor 3 inserted through a strain relief aperture. The bent portion 34 may comprise a radiused portion of the conductor 3 turning back toward the circuit card 1 or circuit card 9 after passage through the strain relief aperture, thereby positioning a conduction portion 32 of the conductor 3 into electrical contact with a conductor contact. In this manner, the conductor 3 may enjoy both electrical continuity with the conductor contact, and strain relief via the strain relief aperture.

With ongoing reference to FIG. 3, a circuit card 1 or circuit card 9 may comprise one or more coating zone 10. A coating zone 10 may comprise a region extending axially (relative to a central axis 5) outward from the circuit card 1 or circuit card 9 and receiving a material coating. Various different material coatings may be applied, having various different thicknesses and material properties. In various embodiments, a material coating is applied following the interfacing of a conductor 3 with the circuit card 1 or circuit card 9. In this manner, the circuit card 1 or circuit card 9 comprising various coating zones 10 may be configured to interact in various ways with a conductor 3, surrounding structures such as a back shell, and/or the like. For instance, various coating zones 10 may receive a coating having various moisture barrier characteristics, dielectric constants, strengths, adhesive properties, and/or the like.

A circuit card 1 or circuit card 9 may comprise a conformal coating. The conformal coating may have various regions. For example, a conformal coating may have a proximal coating zone 101 having a backside depth 104 and a front side depth 102, a mesial coating zone 110 having a mesial coating zone depth 112, and a distal coating zone 120.

In various embodiments the proximal coating zone 101 comprises a conformal coating of a poly(p-xylylene) polymer, for example a halogenated parylene, a reactive parylene, or any desired parylene. For instance, the coating may comprise parylene N, or parylene C, or parylene X, or any parylene having properties as desired. The parylene may be disposed on the aft (e.g., toward the direction of the conductor 3 and away from the plane of the circuit card 1) side of the circuit card 1 or circuit card 9 extending to a backside depth 104. Moreover, the parylene may also be disposed on the front (e.g., away from the direction of the conductor 3 and away from the plane of the circuit card) side of the circuit card 1 or circuit card 9 extending to a front side depth 102.

Moreover, the mesial coating zone 110 may comprise a conformal coating of a poly(p-xylylene) polymer, for example a halogenated parylene, a reactive parylene, or any desired parylene. For instance, the coating may comprise parylene N, or parylene C, or parylene X, or any parylene having properties as desired. The parylene may be axially outboard of the proximal coating zone 101 and on the aft (e.g., toward the direction of the conductor 3 and away from the plane of the circuit card) side of the circuit card 1 or circuit card 9. The mesial coating zone 110 may extend to a mesial coating zone depth 112.

Finally, a distal coating zone 120 may comprise an area wherein conformal coating is prohibited. Thus, a distal coating zone 120 may comprise a region axially outward of the mesial coating zone 110 and on the aft (e.g., toward the direction of the conductor 3 and away from the plane of the circuit card) side of the circuit card 1 or circuit card 9.

The front side depth 102 may comprise a depth sufficient to overlay the bent portion 34 of a conductor 3. For instance, in various embodiments, the front side depth 102 may comprise between about 0.115 inches (about 2.921 mm) to about 0.15 inches (about 3.81 mm).

The backside depth 104 may comprise a depth sufficient to overlay a desired portion of the conductor 3, to achieve a desired property, for instance, adhesion of the conductor 3 to the circuit card 1 or circuit card 9 and/or a back shell, dielectric properties, and or the like. In various embodiments, the backside depth 104 comprises about 0.25 inches (about 6.35 mm) to about 0.75 inches (about 190.05 mm). In various embodiments, the backside depth 104 comprises about 0.50 inches (about 12.7 mm).

Finally, the mesial coating zone 110 may comprise a depth sufficient to overlay a desired portion of the conductor 3, to achieve a desired property, for instance, adhesion of the conductor 3 to the circuit card 1 or circuit card 9 and/or a back shell, dielectric properties, and/or the like. In various embodiments, the mesial coating zone depth 112 comprises about 0.50 inches (about 12.7 mm) to about 10.0 inches (about 25.4 mm). In various embodiments, the mesial coating zone depth 112 comprises about 0.75 inches (about 19.05 mm).

In each coating zone wherein a conformal coating, such as of parylene, is applied, the conformal coating may be applied according to a desired thickness. For example, conformal coating may be applied to proximal coating zone thickness within the proximal coating zone 101. In various embodiments, the proximal coating zone thickness comprises a thickness of about 0.0005 (about 12.7 microns) inches to about 0.002 (about 50.8 microns) inches, or about 0.0005 (about 12.7 microns) inches to about 0.0007 (about 17.78 microns) inches or about 0.001 (about 25.4 microns) inches within the proximal coating zone 101, although any thickness as desired may be implemented. The conformal coating may be applied to a mesial coating zone thickness within the mesial coating zone 110. For example, the conformal coating may be applied to a mesial coating zone thickness comprising about 0.0000 to about 0.0007 (about 17.78 microns) inches within the mesial coating zone 110. As mentioned, conformal coating may be prohibited to be applied in the distal coating zone 120.

Thus, various layers of conformal coating may be applied to various thicknesses whereby various material properties are achieved.

Figure 4:
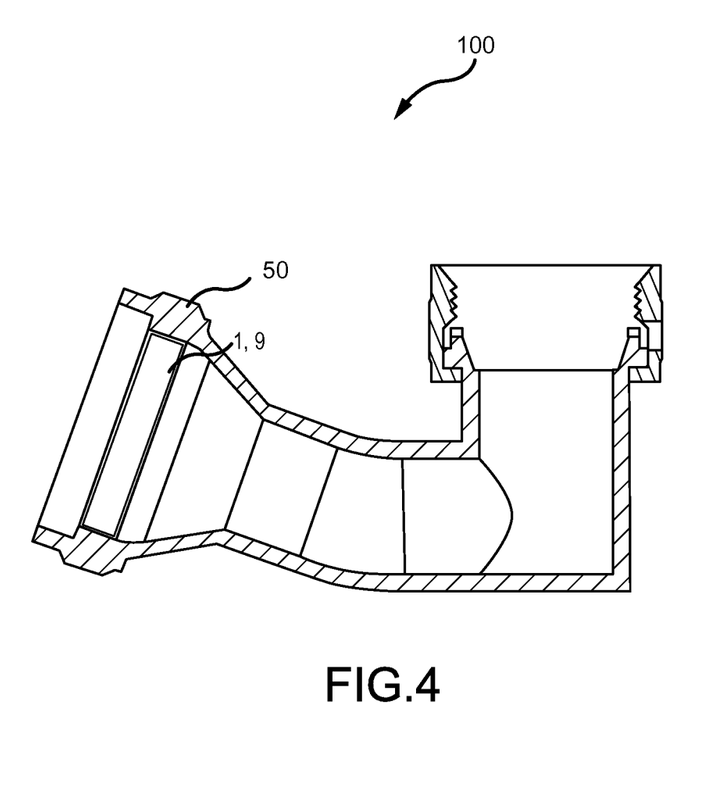
FIG. 4 depicts an electrical wiring system comprising a circuit card and a connector back shell, in accordance with various embodiments.

With reference now to FIG. 4, an example circuit card 1 or circuit card 9 is depicted in connection with a connector back shell 50, according to various embodiments. The combination of a circuit card 1 or circuit card 9 and a connector back shell 50 may comprise an electrical wiring system 100. As illustrated, a circuit card 1 or circuit card 9 may be disposed within the connector back shell 50 of a connector, whereby the signals, and/or power conducted via cabling connectorized at the connector back shell 50 of the connector may be conditioned. In this manner, electronic circuitry may be efficiently packaged with a connector back shell 50. In various embodiments the electrical wiring system 100 comprising a circuit card 1 or circuit card 9 and connector back shell 50 are field combinable. For instance, a circuit card 1 or circuit card 9 may be bondable to the connector back shell 50 by an adhesive. The circuit card 1 or circuit card 9 may be bondable to the connector back shell 50 by an adhesive directly joining between the conformal coating of the circuit card and the connector back shell 50. In this manner, the integrity of the conformal coating may be maintained. For instance, the bond may be accomplished without breaking of the conformal coating because the adhesive may bond directly between the conformally coated circuit card 1 or circuit card 9 and the connector back shell 50. For instance, two-sided tape and/or another desired adhesive may be disposed about the circumferentially outward edge of the circuit card 1 or circuit card 9 and/or along a portion of a face of the circuit card 1 or circuit card 9 (such as over a portion of a stay out zone 2 (FIGS. 1-2)) whereby the circuit card 1 or circuit card 9 may be press-fit against a portion of the connector back shell 50. In various embodiments, the circuit card 1 or circuit card 9 is conformally coated prior to joining with the connector back shell 50. In further embodiments, all or a portion of the electrical wiring system 100 is conformally coated after the circuit card 1 or circuit card 9 and the connector back shell 50 are joined.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the inventions. The scope of the inventions is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A circuit card comprising a printed circuit board comprising:
   a first strain relief aperture positioned in and extending through a stay out zone of the circuit card proximate to a boundary edge of the circuit card; and
   a first conductor contact positioned in a conductor interface region of the circuit card proximate the stay out zone and radially inward of the stay out zone relative to a central axis of the circuit card,
   wherein a populated region of the circuit card configured to be populated with electronic components comprises a region of the circuit card radially inward of the conductor interface region; and
a conformal coating of a poly(p-xylylene) polymer,
wherein the conformal coating comprises:
a proximal coating zone comprising a backside depth and a front side depth wherein the conformal coating comprises a proximal coating zone thickness; and
a mesial coating zone disposed axially outward of the proximal coating zone relative to the central axis of the circuit card and comprising a mesial coating zone depth wherein the conformal coating comprises a mesial coating zone thickness.

2. The circuit card according to claim 1, further comprising a bore comprising an opening disposed through the circuit card and positioned radially inward of the populated region.

3. The circuit card according to claim 2, wherein the bore is located at a center of the circuit card.

4. The circuit card according to claim 3, wherein the bore comprises a square aperture.

5. The circuit card according to claim 1, further comprising a labeling area comprising a crescent shaped partial annulus disposed within the populated region and radially opposite the first strain relief aperture.

6. The circuit card according to claim 1, wherein the first conductor contact comprises at least one of a solder pad and a through hole.

7. The circuit card according to claim 1, wherein a conductor is received through the first strain relief aperture and connected in electrical communication with the first conductor contact.

8. An electrical wiring assembly comprising:
a connector back shell;
a circuit card disposed within the connector back shell, whereby at least one of signals and power conducted via a cable connectorized at the connector back shell are conditioned,
wherein the circuit card comprises:
a first strain relief aperture positioned in and extending through a stay out zone of the circuit card proximate to a boundary edge of the circuit card;
a first conductor contact positioned in a conductor interface region of the circuit card proximate the stay out zone and radially inward of the stay out zone relative to a central axis of the circuit card,
wherein a populated region of the circuit card populated with electronic components comprises a region of the circuit card radially inward of the conductor interface region; and
a conformal coating of a poly(p-xylylene) polymer,
wherein the connector back shell is bonded directly to the circuit card by an adhesive disposed between the conformal coating of the circuit card and the connector back shell, and
the conformal coating comprises:
a proximal coating zone comprising a backside depth and a front side depth wherein the conformal coating comprises a proximal coating zone thickness; and
a mesial coating zone disposed axially outward of the proximal coating zone relative to the central axis of the circuit card and comprising a mesial coating zone depth wherein the conformal coating comprises a mesial coating zone thickness.

9. The electrical wiring assembly according to claim 8, wherein the circuit card further comprises a bore comprising an opening disposed through the circuit card and positioned radially inward of the populated region.

10. The circuit card according to claim 1, wherein the mesial coating zone thickness and the proximal coating zone thickness are different.

11. The circuit card according to claim 1,
wherein the proximal coating zone thickness comprises about 0.0005 to about 0.002 inches, and
wherein the mesial coating zone thickness comprises about 0.0000 to about 0.0007 inches.

12. The circuit card according to claim 1,
wherein the backside depth comprises about 0.05 inches,
wherein the front side depth comprises between about 0.0015 inches to about 0.015 inches, and
wherein the mesial coating zone depth comprises about 0.75 inches.

13. The circuit card according to claim 1,
wherein the backside depth comprises about 0.05 inches,
wherein the front side depth comprises between about 0.0015 inches to about 0.015 inches,
wherein the mesial coating zone depth comprises about 0.75 inches,
wherein the proximal coating zone thickness comprises about 0.0005 to about 0.002 inches, and
wherein the mesial coating zone thickness comprises about 0.0000 to about 0.0007 inches.

14. The electrical wiring assembly according to claim 9, wherein the bore is located at a center of the circuit card.

15. The electrical wiring assembly according to claim 14, wherein the bore comprises a square aperture.

16. A method of making a circuit card comprising a printed circuit board comprising:
forming a first strain relief aperture positioned in and extending through a stay out zone of the circuit card proximate to a boundary edge of the circuit card; and
forming a first conductor contact positioned in a conductor interface region of the circuit card proximate the stay out zone and radially inward of the stay out zone relative to a central axis of the circuit card,
wherein a populated region of the circuit card configured to be populated with electronic components comprises a region of the circuit card radially inward of the conductor interface region; and
forming a conformal coating of a poly(p-xylylene) polymer over at least a portion of the circuit card,
wherein the conformal coating comprises:
a proximal coating zone comprising a backside depth and a front side depth wherein the conformal coating comprises a proximal coating zone thickness; and
a mesial coating zone disposed axially outward of the proximal coating zone relative to the central axis of the circuit card and comprising a mesial coating zone depth wherein the conformal coating comprises a mesial coating zone thickness.

* * * * *